July 3, 1928. Re. 17,017
W. C. BUCHHOLZ ET AL
ILLUMINATED DIAL
Original Filed May 19, 1925
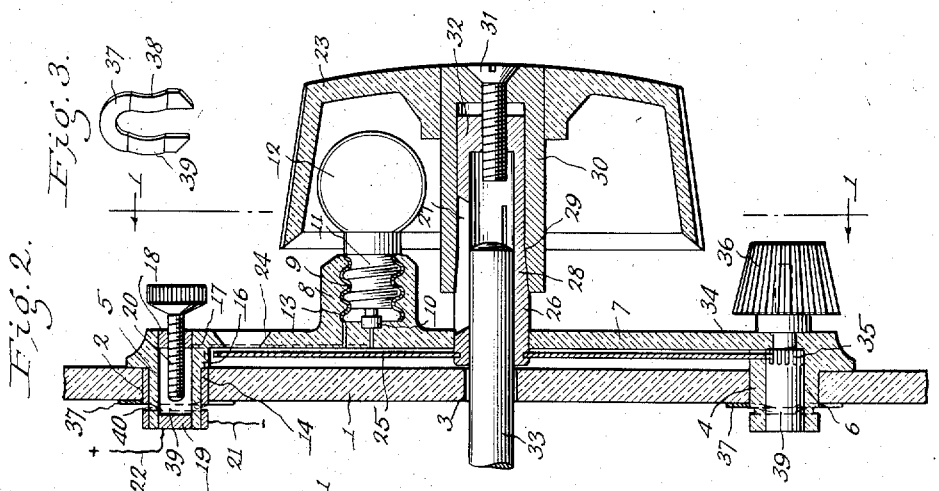
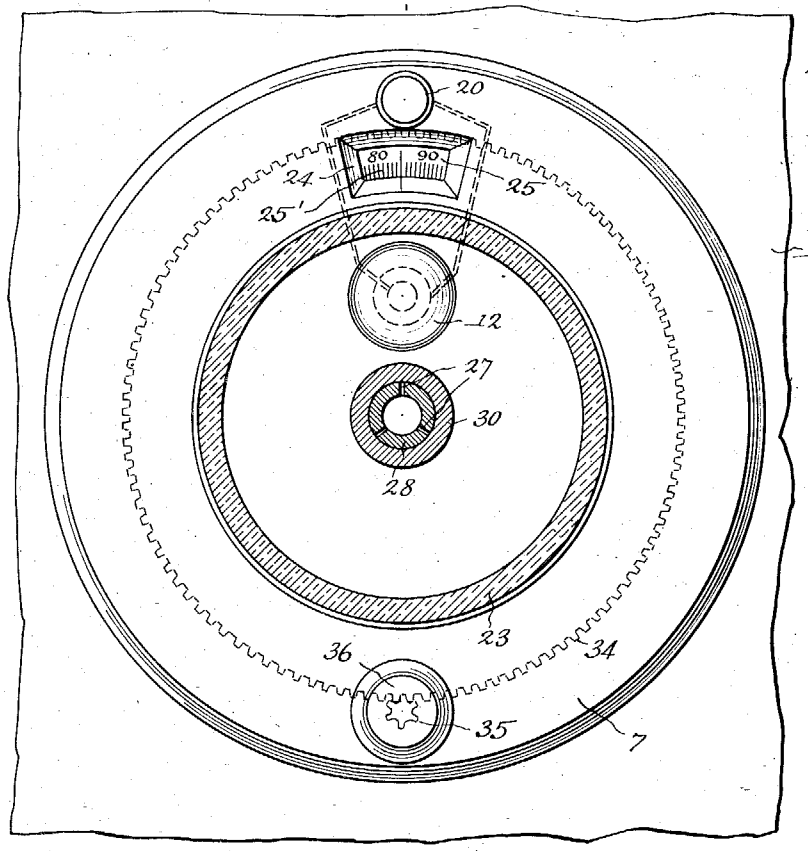
WITNESSES
A. J. Frank.
A. L. Ritchie.
INVENTOR
WILLIAM C. BUCHHOLZ
FRANK BUCHHOLZ
BY Munn & Co.
ATTORNEYS Reissued July 3, 1928. Re. 17,017

UNITED STATES PATENT OFFICE.

WILLIAM C. BUCHHOLZ AND FRANK BUCHHOLZ, OF BROOKLYN, NEW YORK.

ILLUMINATED DIAL.

Original No. 1,566,069, dated December 15, 1925, Serial No. 31,368, filed May 19, 1925. Application for reissue filed October 4, 1926. Serial No. 139,540.

This invention relates to dials and particularly to an improved illuminated dial for use on radio apparatus, an object being to provide a construction which may be readily applied to the cabinet of a radio apparatus and connected up to the various parts thereof without re-arranging any of the parts.

Another object of the invention is to provide an illuminated dial for radio apparatus wherein the dial may be illuminated for a short or long time without illuminating to any appreciable extent the surrounding objects.

A further object of the invention is to provide an illuminated dial wherein the parts are so arranged that the illuminated lamp is hooded by an object adjacent the dial and particularly by the adjusting knob.

A still further object of the invention is to provide an illuminated dial in connection with a supporting plate and an adjusting knob, the parts being so arranged that the entire assemblage may be applied and removed at any time.

In the accompanying drawing—

Figure 1 is a sectional view through Figure 2 on line 1—1, the same disclosing an embodiment of the invention.

Figure 2 is a sectional view through Figure 1 on line 2—2, said figure illustrating the details of an illuminated dial disclosing the invention.

Figure 3 is a detail perspective view of a clip embodying certain features of the invention.

Referring to the accompanying drawing by numerals, 1 indicates the panel of a radio apparatus, as for instance, an ordinary receiving set. In properly adjusting or tuning the set, it is necessary to provide dials and adjusting means therefor. In many cases, the radio apparatus is placed where the light is not good, particularly towards evening and, consequently, means must be provided for securing light so that the dials may be seen in order to secure the desired adjustment. In the present invention, means have been provided which will readily illuminate that part of the dial to be examined without illuminating much of the surrounding space or articles. The invention further contemplates the use of a dial hidden from view with the exception of a small part thereof, as well as a hooded lamp.

As illustrated in the drawing, the panel 1 is provided with bores 2, 3 and 4, bores 2 and 4 receiving the inwardly extending hollow studs 5 and 6 which are preferably integral with the plate 7. The plate 7 is preferably made from rubber, bakelite or other material which may have the same appearance as panel 1. In forming the plate 7, a socket 8 is formed thereon preferably integral therewith. This socket is provided with a metal threaded lining 9 and a central contact 10, said lining and contact co-acting with the threaded sleeve 11 on the lamp 12 and the central contact 13 on the lamp 12. The post 5 is provided with a metal bushing or sleeve 14 which snugly fits the same, said bushing or sleeve being connected by a suitable wire 16 to one of the terminals in the socket 8 while the opposite terminal in socket 8 is connected by wire 17 to the metal bushing 18, said metal bushing being arranged in the hollow post 5 and held in place by any desired means, as for instance, friction. The metal contact plug 19 is also arranged in the post 5 and co-acts with a threaded member 20 for closing the circuit. It will be noted that the sleeve 14 is connected to a suitable source of current by wire 21 and contact plug 19 is connected to the opposite side of the same source of current by wire 22.

In operation, whenever the lamp 12 is to be lighted, screw 20 is rotated manually until the same contacts with the plug 19 whereupon the circuit of the lamp will be closed and it will burn until the circuit has been opened which may be done by reversing the action of screw 20. The lamp 12 is positioned within the hollow part of the knob 23 whereby it is hooded but is permitted to illuminate the window 24 and surrounding objects as well as that part of the dial 25 which may be seen through the window. Dial 25 is provided with suitable graduations for indicating the relative position of the parts. The dial 25 is rigidly connected in any desired manner with a hollow shaft 26 provided with a number of slits 27 and with a tapering section 28 adapted to be engaged by the tapering section 29 of the sleeve 30. The knob 23 is rigidly connected with the sleeve 30 in any desired manner, said sleeve being made of metal and carrying a screw 31 threaded into the thickened portion 32 of the hollow shaft 26. Whenever the screw 31 is tightened or rotated in a certain direction, the same will cause the sleeve 30 to telescope over the shaft 26 and as the bevel surface 28 moves over the tapering portion 29, the various sections or parts of the shaft 26 between the slits 27 will gradually move in or collapse and thereby pinch tightly the shaft 33 which is connected to the instrument within the radio apparatus which is to be adjusted, as for instance, a variable condenser. The dial 25 is preferably provided with teeth 34 with which the small pinion 35 meshes, said pinion being rigidly connected to a knob 36 in any desired manner whereby when said knob is rotated the dial may be rotated. In order to hold the plate 7 and associated parts properly on the panel 2, resilient clips 37 are provided, said clips being substantially U-shaped as shown in Figure 3 and provided with bowed up portions 38 and 39. These bowed up portions are adapted to fit into the grooves 40 of the respective members 5 and 6. It will be seen from the drawing that the dial 25 is completely hidden except for that part seen through the window 24. A lamp is provided for illuminating that part of the dial exposed through the window 24 and in order that the light will not shine into the eyes of the observer, a suitable hood is provided. To illustrate one embodiment of the invention, the knob 23 has been formed as a hood and covers the lamp sufficiently to present an efficient hood.

What we claim is:

1. An illuminated dial, comprising a plate, means for mounting the plate, a rotatable disk formed with graduations acting as a dial member, said plate being formed with a window for exposing to view part of said plate and the graduations thereon, a lamp carried by said plate for illuminating said window and the surrounding parts, and a knob extending through said plate carrying said disk, said knob being substantially hollow and open on one face, the knob being so positioned as to act as a hood for said lamp.

2. The combination with a radio apparatus having a shaft extending through the front panel, of a plate connected to said panel and provided with an opening through which said shaft extends, a hollow shaft surrounding the first mentioned shaft, said hollow shaft being collapsible so as to pinch said first mentioned shaft, means for collapsing said hollow shaft, a knob connected with said hollow shaft and acting as a handle therefor and also as a hood, a lamp carried by said plate projecting into said knob, said lamp being positioned to illuminate part of said plate, said plate being formed with a window positioned to be illuminated by said lamp, a dial plate secured to said hollow shaft and formed with graduations adapted to move past said window as the dial plate is rotated, and a manually actuated switch for said lamp for opening and closing the circuit thereof.

3. The combination with a radio apparatus formed with a panel and a shaft extending through the panel, of a plate removably connected to said panel, an actuating member for said shaft, said actuating member including a hollow knob open on the side facing the plate, said plate being formed with an electrical socket, a lamp mounted in said socket and projecting to a position within said knob but arranged to illuminate part of the plate, said plate being formed with a window at the point illuminated by said lamp, a dial connected with said knob, said dial being formed with graduations adapted to be moved past said window, and a manually actuated switch for opening and closing the circuit of said lamp.

4. The combination with a radio apparatus provided with a dial, of means including a lamp for illuminating said dial, and a knob for actuating said dial, said knob being formed as a hood for covering part of said lamp so that the same will illuminate the dial.

5. The combination with a radio apparatus provided with a dial, of a plate normally covering said dial, said plate having a window for exposing part of the dial, means carried by the plate forming an electrical socket for receiving a lamp, and a knob for adjusting said dial, said knob being formed with an overhanging apron adapted to overhang said lamp so as to hood the same.

6. The combination with a radio apparatus provided with a dial, of means acting as a cover for said dial except at one portion, means including an electric lamp for illuminating the exposed portion of said dial, and a knob for actuating said dial, said knob covering part of said lamp.

WILLIAM C. BUCHHOLZ.
FRANK BUCHHOLZ.